United States Patent [19]
Yu

[11] Patent Number: 5,677,546
[45] Date of Patent: Oct. 14, 1997

[54] POLYMER LIGHT-EMITTING ELECTROCHEMICAL CELLS IN SURFACE CELL CONFIGURATION

[75] Inventor: Gang Yu, Goleta, Calif.

[73] Assignee: Uniax Corporation, Santa Barbara, Calif.

[21] Appl. No.: 444,998

[22] Filed: May 19, 1995

[51] Int. Cl.$^6$ ............................ H01L 35/24; H01L 51/00
[52] U.S. Cl. ...................... 257/40; 257/88; 257/91; 257/99; 257/103; 313/504
[58] Field of Search ........................ 257/40, 99, 103, 257/88, 91; 313/504

[56] References Cited

U.S. PATENT DOCUMENTS

| | | | |
|---|---|---|---|
| 3,404,304 | 10/1968 | Bonin et al. | 257/91 X |
| 3,701,043 | 10/1972 | Zuleeg et al. | 257/99 X |
| 3,900,418 | 8/1975 | Bard et al. | 252/62.2 |
| 4,539,507 | 9/1985 | VanSlyke et al. | 313/504 |
| 5,155,566 | 10/1992 | Nakayama et al. | 257/103 X |
| 5,189,549 | 2/1993 | Leventis et al. | 359/271 |
| 5,247,190 | 9/1993 | Friend et al. | 257/40 |
| 5,250,820 | 10/1993 | Sawase et al. | 257/99 |
| 5,258,629 | 11/1993 | Itoh et al. | 257/99 X |
| 5,408,109 | 4/1995 | Heeger et al. | 257/103 X |

FOREIGN PATENT DOCUMENTS 59-188181  10/1984  Japan ............................ 257/99

*Primary Examiner*—William Mintel
*Attorney, Agent, or Firm*—Burns, Doane, Swecker & Mathis, L.L.P.

[57] ABSTRACT

Light-emitting electrochemical cells are produced with a surface cell configuration. In preferred embodiments the cells employ organic semiconducting polymers and particularly ion doped conjugated organic semiconducting polymers as active light-emitting materials.

24 Claims, 5 Drawing Sheets

POLYMER LIGHT-EMITTING ELECTROCHEMICAL CELLS IN SURFACE CELL CONFIGURATION

FIELD OF THE INVENTION

This invention relates generally to the fabrication of light-emitting electrochemical cell devices from semiconducting (conjugated) pollers; said electroluminescent devices in a surface cell configuration. Such surface light-emitting electrochemical cells offer a new type of flat panel display which can be viewed from both sides of the panel and can be made with plastic materials such that they are fully flexible.

BACKGROUND OF THE INVENTION

Electroluminescent (EL) devices have become increasingly important within the past decade due to the growing needs and opportunities of the display industry. Conventional EL devices can be classified into two categories:

1. Schottky barrier diodes or pn junction diodes in which carrier recombination occurs inside of (or close to) the junction, examples are GaAs and $GaAs_xP_{1-x}$ light emitting diodes [S. M. Sze, *Physics of Semiconductor Devices*, Wiley, New York, 1981].

2. Thin film devices in a sandwich (multi-layer) configuration comprising an active luminescent, semiconducting material laminated between two electrodes. One of the electrodes is made semi-transparent, thereby allowing the emitting light to exit from the device. Both inorganic materials such as ZnS:Mn and organic materials such as organic dye molecules [C. W. Tang and S. A. Van Slyke, Appl. Phys. Lett. 51 (1987) 913; J. Appl. Phys. 65 (1989) 3610] and conjugated polymers [H. Burroughes, D. D. C. Bradley, A. R. Brown, R. N. Marks, K. Mackay, R. H. Friend, P. L. Burns and A. B. Holmes, Nature 347 (1990) 530; D. Braun and A. J. Heeger, Appl. Phys. Lett. 58 (1991) 1982] have been used in this general type of electroluminescent device. Although similar in device configuration, the device physics is quite different between ZnS:Mn type devices and the organic/polymer devices of the second category. The former are based upon carrier impact ionization at high electric fields, and the latter are based upon carrier injection from the electrodes.

The sandwich type EL devices have attracted attention because of their potential advantages in developing large size, flat panel displays. With a conjugated polymer as the active material, such as, for example, poly(2-methoxy-5-(2'ethyl-hexyloxy)-1,4-phenylene vinylene), MEH-PPV, a semiconducting polymer with energy gap $E_g$-2.1 eV [F. Wudl, P. M. Allemand, G. Srdanov, Z. Ni, and D. McBranch, in *Materials for Nonlinear Optics:Chemical Perspectives*, Ed. S. R. Marder, J. E. Sohn and G. D. Stucky (American Chemical Society, Washington DC, 1991, pp. 683–686], flexible light-emitting diodes and large size, flexible segmented displays have been demonstrated using transparent electrodes such as conducting polyaniline (PANI) and/or indium/tin-oxide (ITO) on glass or on flexible plastic substrates [G. Gustafsson, Y. Cao, G. M. Treacy, F. Klavetter, N. Colaneri, and A. J. Heeger, Nature, 357 (1992) 477]. Such devices have demonstrated colors throughout the visible spectrum and have achieved luminance intensities of several hundred $cd/m^2$ at 3–5 V with external quantum efficiencies of 1.5–4% ph/el.

The polymer electroluminescent devices are carrier injection diode devices. Because of its relatively high work function, transparent ITO has been frequently used as the anode for hole injection into the π-band (or valence band) of the semiconducting polymer. In order to achieve efficient electron injection into the π*-band (or conduction band) of the semiconducting polymer, low work-function metals are required for the cathode [D. Braun and A. J. Heeger, Appl. Phys. Lett. 58 (1991) 1982; I. D. Parker, J. Appl. Phys., 75 (1994) 1656]. Because low work function metals are relatively highly reactive with oxygen and water vapor, such low work function cathode materials have limited lifetimes and require rigorous encapsulation.

The recent invention of the polymer light-emitting electrochemical cell provides a new route to light-emitting organic devices. The polymer light-emitting electrochemical cell is described in detail in U.S. patent application Ser. No. 08/268,763 which is incorporated herein by reference. In these light-emitting electrochemical cells, a p-n junction diode is created in-situ through simultaneous p-type and n-type electrochemical doping on opposite sides, respectively, of a composite film of conjugated polymer (between two electrodes) which contains added ionic species (salt) to provide the necessary counterions for doping. Such polymer light-emitting electrochemical cells have been successfully fabricated with promising results. Blue, green, and orange emission have been obtained with turn-on voltage close to the bandgap of the emissive material.

STATEMENT OF THE INVENTION

A new configuration device has now been discovered. This is a surface cell configuration having a film of electroluminescent material having two sides and with at least one anode and at least one cathode in contact with the same side of the film.

In some embodiments, the electroluminescent material can be an inorganic semiconductor material but more typically is an organic semiconductor material, especially a polymeric material and particularly a conjugated organic polymeric material. In especially advantageous embodiments the electroluminescent material is a electrochemically-dopable conjugated polymer so as to create an electrochemical cell.

In some embodiments the devices additionally comprise a substrate, particularly a transparent substrate.

In some embodiments the anode and cathode are interdigitated.

In other aspects this invention provides methods for preparing these devices and methods for generating useful levels of light from these devices.

BRIEF DESCRIPTION OF THE DRAWINGS

This invention will be further described with reference being made to the drawings in which.

DETAILED DESCRIPTION OF THE INVENTION

Figure 1:
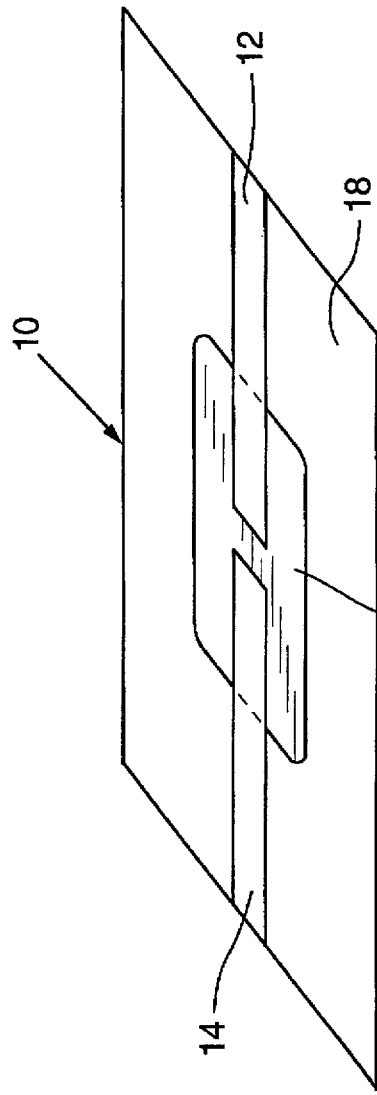
FIG. 1 is a schematic prospective view of an elementary surface cell device of the invention.

A surface cell configuration can be envisioned for thin film EL devices with numerous advantages. In a surface cell configuration, electrodes may be pre-prepared onto a substrate with a gap in between them. For example, a simple surface cell configuration is shown in FIG. 1. Device 10 includes anode 12 and cathode 14 in contact with semiconducting electroluminescent and ionic layer 16 (preferably made of a conducting polymer) carried by substrate 18. Substrate 18 may be flexible plastic if desired and also is often transparent. (Anodes and cathodes 12 and 14 are interchangeable and are commonly metal.) The metal electrodes 12 and 14 can be fabricated on the substrate 18 by, for example, thermal evaporation, electron beam evaporation, sputtering, chemical deposition, printing and so on. The electrodes can be patterned. This can be done either with a shadow mask or by means of photolithographic techniques well known in the art. To improve the photosensitivity (i.e., to increase the length/width ratio of the gap between electrodes), the electrodes 12 and 14 can be fabricated in an interdigitated pattern as shown in b of FIG. 2 where they are shown coupled to switched power supply 20. This interdigitated electrode configuration has been used in polymer field effect transistors to increase the source-to-drain current density for a given gate electrode area [for example, A. Assadi, C. Svensson, M. Wilander and O. Inganas, Appl. Phys. Lett. 53 (1988) 195; F. Garnier, G. Horowitz, X. Peng and D. Fichou, Adv. Mater. 2 (1990) 592].

The interdigitated surface cell electrode configuration has not been used in thin film electroluminescent devices heretofore for a number of reasons. Conventional organic or inorganic semiconducting materials have high bulk resistivities; thus requiring sub-micron dimensions. Different metals are required as the carrier-injecting electrodes. Moreover, since the thin film organic EL devices require high electric fields for carrier injection [I. D. Parker, J. Appl. Phys. 75 (1994) 1656], the use of a surface cell configuration might be considered to require dangerously high voltage operation. For example, a polymer light-emitting diode which turns on at 5 volts in sandwich cell with film thickness of 1000 Å would require approximately 250 volts in a surface cell with interdigitated electrode spacing of 5 μm.

In this invention, we demonstrate for the first time that a surface cell configuration is feasible. In preferred embodiments we overcome the structural and performance limitations of the prior art and provide a new type of electroluminescent device; light-emitting electrochemical cells made in the surface cell configuration. Stable metals such as, for example, gold and silver, and highly conductive polymers such as metallic polyaniline, etc. are used as electrode materials with clear stability advantages. As light-emitting electrochemical cells, the devices turn on at applied voltages comparable with the energy gap of the luminescent, semiconducting material. Such surface configuration light-emitting electrochemical cells enable a new type of flat panel display which can be viewed from both sides and which can be made with plastic materials such that they are fully flexible. In contrast to the conventional light emitting diodes, the thickness and the film qualities (surface roughness, pinholes etc.) of the luminescent semiconducting material are not critical in the surface cell configuration. Moreover, in the surface cell configuration, light-emitting electrochemical cell devices are fabricated in a single step by depositing the semiconducting luminescent material (for example by casting from solution) onto pre-patterned electrodes with no need for subsequent deposition of electrodes after casting the polymer film. Thus, the surface cell configuration offers significant manufacturing advantages over the prior art.

Figure 2:
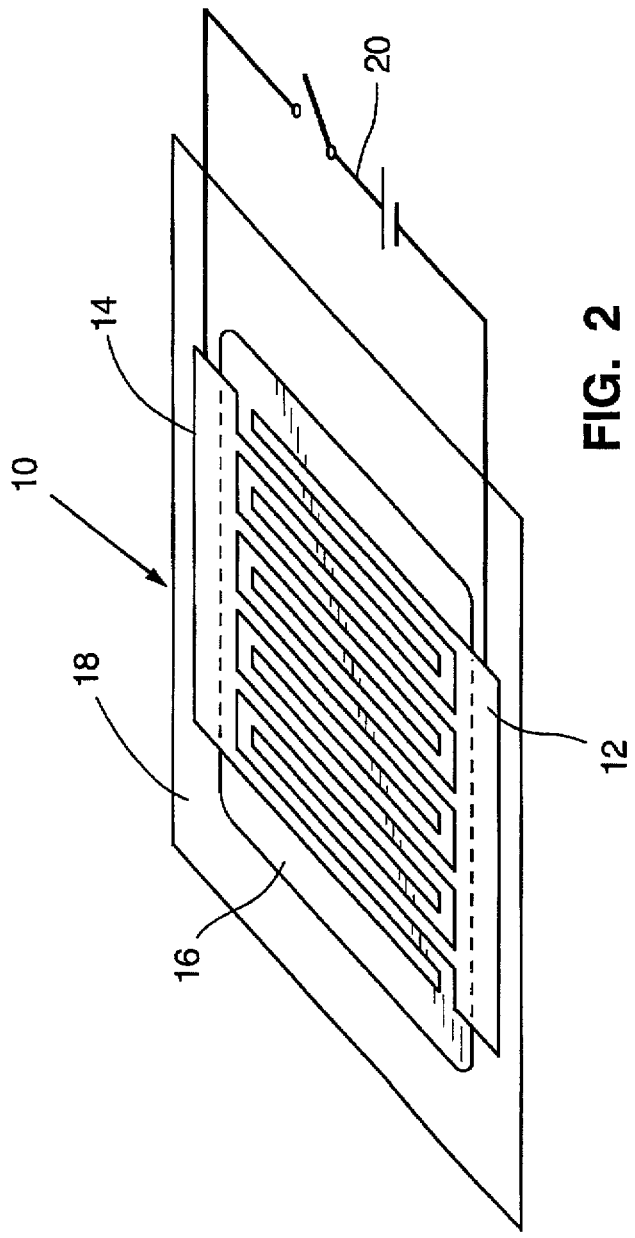
FIG. 2 is a schematic perspective view of another embodiment of the device of this invention.

The invention provides a device configuration such as shown in FIGS. 1 and 2 for implementation of the light-emitting electrochemical cell in a surface cell configuration and a method of obtaining light from said surface light-emitting electrochemical cell.

In one embodiment, the electrodes are interdigitated metal electrodes patterned on the substrate by vacuum deposition through a shadow mask.

In an alternative embodiment, the interdigitated electrodes are patterned onto the substrate using photolithography. The use of photolithographic methods is particularly important when high resolution is required.

In yet another embodiment, the interdigitated electrodes are patterned onto the substrate using the methods of screen printing.

The interdigitated electrodes need not be in the form of straight line patterns. For example, interdigitated spiral patterns can be utilized to obtain an overall shape that is circular or oval. More generally, using the surface cell configuration, the light-emitting area can be patterned into a wide range of unusual, useful and appealing patterns.

The interdigitated electrodes need not be patterned in a symmetric fashion. For example, interdigitated electrodes can be patterned with closely spaced pairs separated from other closely spaced pairs by a larger distance. In this way, overall light emission intensity can be controlled by the electrode geometry since on the fraction of the total area which is between the closely spaced pairs will be bright. This means that light-emitting cells can be designed and fabricated to operate at a specific optimum voltage (for example, highest efficiency, longest lifetime, etc.) with different brightness or different patterns of brightness.

A preferred embodiment utilizes transparent substrates, for example, glass or plastic, so that the light emitted from the surface light-emitting electrochemical cell can be seen from either side. Such surface light-emitting electrochemical cells enable a new type of flat light source which can be viewed from both sides.

In yet a more preferred embodiment, the substrate is a flexible transparent plastic. Such surface light-emitting electrochemical cells enable a new type of flat panel display which can be made with plastic materials such that they have a thin profile and such that they are fully flexible.

As described in U.S. patent application Ser. No. 08/268, 763, the active medium of a polymer light-emitting electrochemical cell (LEEC) is a blend of a semiconducting and luminescent polymer containing a sufficient density of ionic species (i.e. with sufficient salt) as additive to provide the counterions necessary for p-type and n-type doping. In addition, since the ions must be mobile during the in-situ electrochemical doping, an ionically conductive material is required. That ionically conducting material can be the semiconducting and luminescent polymer, possibly enhanced by blending with a known ion transport polymer (for example, polyethylene-oxide, "PEO"). In the surface cell configuration, this blend is deposited onto a substrate; said substrate having a pre-patterned array of interdigitated electrodes on its surface. Light is emitted between the electrode pairs.

The polymer solid state light-emitting electrochemical cell is based on the following operating principles:

(i) The electrodes $M_1$ and $M_2$ form good electrical contact to the medium between them, and remain inert in the electrochemical reactions;

(ii) The electrolyte (ion pairs plus ionically conductive material) is initially distributed uniformly throughout the active medium, such that the medium has ionic conductivity $\geq 10^{-8}$ S/cm;

(iii) The fluorescent species is also distributed uniformly and must be capable of both p-type and n-type doping;

(iv) The doping profile is dynamically changed in a controlled fashion through reversible electrochemical oxidation and reduction to form a p-type layer on one side, an n-type layer on the opposite side, and a p-n junction at the interface between the two. Light emission is from the compensated region within the p-n junction.

The devices comprise pre-patterned metal contacts in surface configurations (such as, for example, that shown in FIGS. 1 and 2) on flat or curved substrates on either rigid or flexible substrates.

A variety of substrates can be used, for example either plastic or glass, with plastic substrates offering the particular advantage of device flexibility. Because of the surface cell configuration, the substrate need not be transparent; thus allowing a wide range of substrates, including, for example, semiconductors, ceramics, and metals. Metallic substrates require an insulating layer between the substrate and the surface cell. Such an insulating layer can be patterned such that one of the interdigitated electrodes can be the metal substrate.

A principal advantage obtained with the use of transparent substrates is that the light emitted from the surface cell light-emitting electrochemical cell can be seem from either side. Such surface light-emitting electrochemical cells therefore enable a new type of flat light source which can be viewed from both sides and which can be made with plastic materials such that they have a thin profile and such that they are fully flexible.

In the surface cell configuration of the light-emitting electrochemical cell, the electrodes are interdigitated metal electrodes patterned on the substrate. The interdigitated electrode pattern can be fabricated by a variety of methods; for example, by vacuum deposition through a shadow mask, by screen printing, or by using the methods of photolithography, or by the use of a variety of other methods known in the art. The use of photolithographic methods is particularly important when high spatial resolution is required.

The electrodes can be patterned by laser ablation of a thin film conducting layer (metal or doped conducting polymer). The electrodes can be patterned by UV degradation; for example conducting polyaniline can be converted into an insulator by exposure to intense UV radiation.

The interdigitated electrodes need not be in the form of straight line patterns. For example, interdigitated spiral patterns can be utilized to obtain an overall shape that is circular or oval. More generally, using the surface cell configuration, the light-emitting area can be patterned into a wide range of unusual, useful and appealing patterns. The interdigitated electrodes need not be patterned in a symmetric fashion. For example, interdigitated electrodes can be patterned with closely spaced pairs separated from other closely spaced pairs by a larger distance. In this way, overall light emission intensity can be controlled by the electrode geometry; for example only a fraction of the total area can be used and the device designed and fabricated to operate at a specific optimum voltage (for example, highest efficiency, longest lifetime etc.) with different brightness or different patterns of brightness.

The metallic material to be used for the interdigitated electrodes can be conventional metals (such as Au, Cu or Al), conducting polymers such as, for example, polyaniline in the conducting emeraldine salt form, conducting oxides such as indium/tin oxide, etc., the principal requirement being that said electrode materials form good electrical contact to the medium between them, and remain inert in the electrochemical doping reactions. The metals which form the interdigitated electrodes can be the same or they can be different. The use of identical, stable electrode materials is preferred to facilitate the fabrication of the interdigitated pattern.

The semiconducting, luminescent and ionically conducting material which comprises the active light-emitting region between the electrodes is described in detail in U.S. patent application Ser. No. 08/268,763 which is incorporated by reference. The active material can be deposited between the electrodes in the surface cell configuration by a variety of convenient and well-known methods, including casting from solution, dip-coating the pre-patterned substrate into a solution containing the active material, vapor deposition, etc.

Film thicknesses for the active semiconducting, luminescent and ionically conducting material are not critical and range from a few hundred Angstrom units to a few microns, or even thicker. A limitation on the thickness is set by the transparency of the active material at the wavelength of emission. For efficient external generation of light the film thickness should be such that the optical density at the emission wavelength is less than unity (OD<1).

For devices used for viewing in both front and back directions, it is desirable that the device be semi-transparent throughout the visible spectrum. Thus, for active luminescent materials with absorption gap less than 2.3 eV, film thicknesses should be limited such that the optical density (OD) at the absorption peak <3; typically less than 6000 Å for most conjugated polymers. For large band gap, blue-emitting devices with low absorption throughout the visible spectrum, transparency does not limit the thickness.

In the surface cell configuration, pinholes and mechanical flaws in the polymer layer are not crucial to device failure (via electrical shorts), an important advantage of surface cell over sandwich cell. Thus, the film quality requirements (such as, for example, thickness uniformity) are less demanding for the surface cell than for the sandwich cell. This advantage greatly simplifies the device fabrication procedure, thus resulting in significant simplification of the manufacturing process and therefore in significant cost reduction.

Arrays or matrices of such devices can be fabricated by electrode patterning. Relatively large sizes can be fabricated with, for example, many units repeated on a single sheet or with a single complex pattern extending over a relatively large area.

Figure 3:
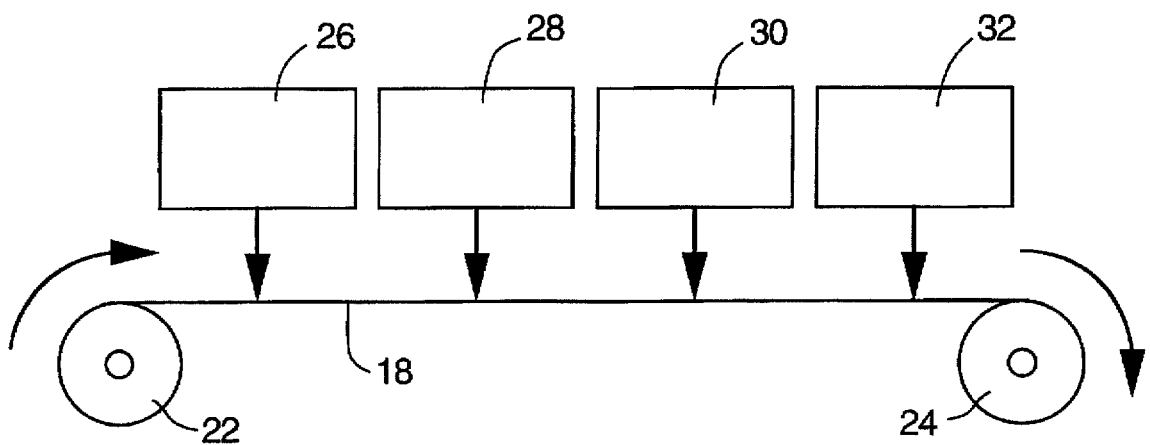
FIG. 3 is a schematic representation of a process used to prepare the devices of this invention.

With the electrodes patterned, for example, by laser ablation or by UV degradation, a continuous manufacturing process (using linear coating technology for the semiconducting, luminescent and ionically transporting material) can be envisioned in a "roll to roll" process as shown schematically in FIG. 3. As shown in FIG. 3, a device of this invention can be continuously prepared by passing a sheet of flexible substrate 18 from feed spool 22 to take-up spool 24. As substrate 18 passes under station 26, a layer of conductive electrode-forming material is deposited. At station 28, this layer is patterned with U.V. light to give use to a pattern of interdigitated electrodes. At station 30 a layer of electroluminescent material in deposited onto the interdigitated electrodes. Thereafter, at station 32 an optional protective overlayer is applied. In steps not shown, the continuous sheet is cut into individual devices. An important advantage is that vacuum evaporation equipment need not be involved in the manufacturing line.

This invention will be further described by the following examples which are not to be construed as limitations to the claims.

EXAMPLES

Example 1

Surface light-emitting electrochemical (LEEC) cell devices were fabricated by drop casting an active blend of semiconducting luminescent polymer (MEH-PPV) and ionic species source from solution onto a substrate with interdigitated gold electrodes fabricated by photolithographic methods. The preparation of the active blend has been described in detail in U.S. patent application Ser. No. 08/268,763. The gap size between the interstitial electrodes was 5 μm.; the total device size was 5 mm×5 mm (see FIG. 2). This interdigitated electrode pattern is equivalent to a single gap surface cell (see FIG. 1) with length of 500×5 mm=2.5 m and width of 5 μm. The equivalent length (L) to width (W) ratio (L/W) is 5×10$^5$. These values are exemplary. Typical gap widths are from about 1 μm to about 100 μm and preferably 1.5 μm to 50 μm and especially 2 μm to 40 μm. Electrode widths can be similar widths although wider electrodes can also be used.

Electrical data were obtained with a Keithley 236 Source-Measure Unit. The light illumination intensity and luminance were monitored with a Si photodiode calibrated with an integrating sphere.

Figure 4:
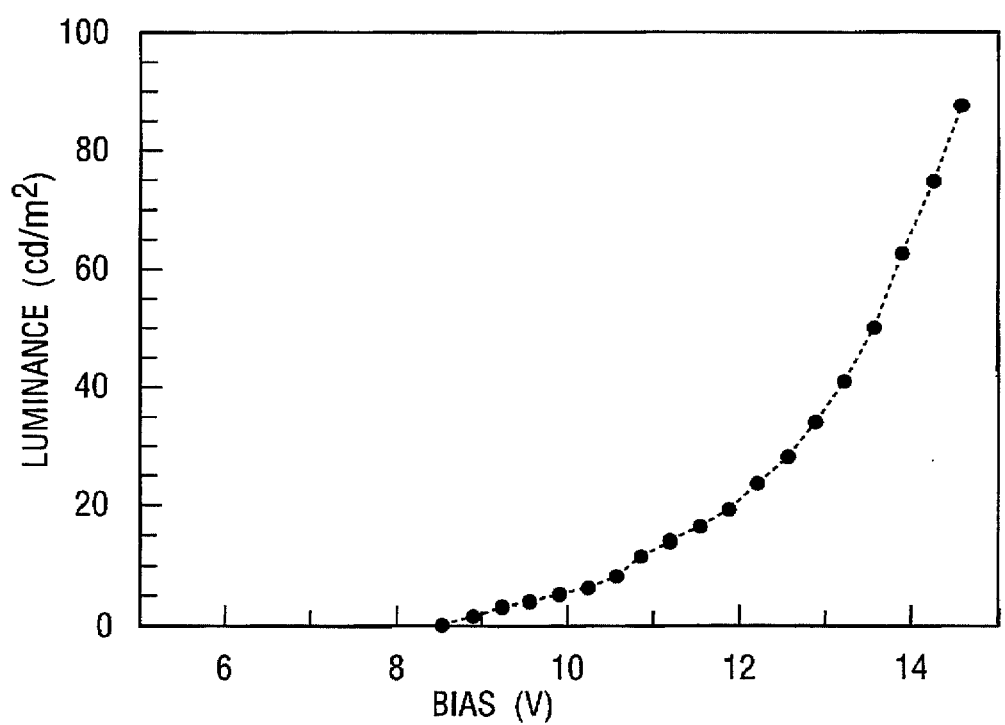
FIG. 4 and FIG. 5 are graphs of luminescence vs voltage for the present devices.

FIG. 4 shows the luminance as a function of bias voltage for a 5 μm gap device. Light was detected for V<5 V. The emitted light reached an intensity of approximately 100 cd/m$^2$ at −15 V. The color of the emitted light was characteristic of the emission from MEH-PPV and was similar to that observed in light-emitting electrochemical cell devices fabricated in the sandwich cell configuration.

This example demonstrates low-voltage light emission from the light-emitting electrochemical cell in the surface cell configuration. Radiative recombination of the injected carriers occurs in the semiconducting, luminescent and ionically conducting blend; said radiation originating from the conjugated polymer as the luminescent medium.

Figure 5:
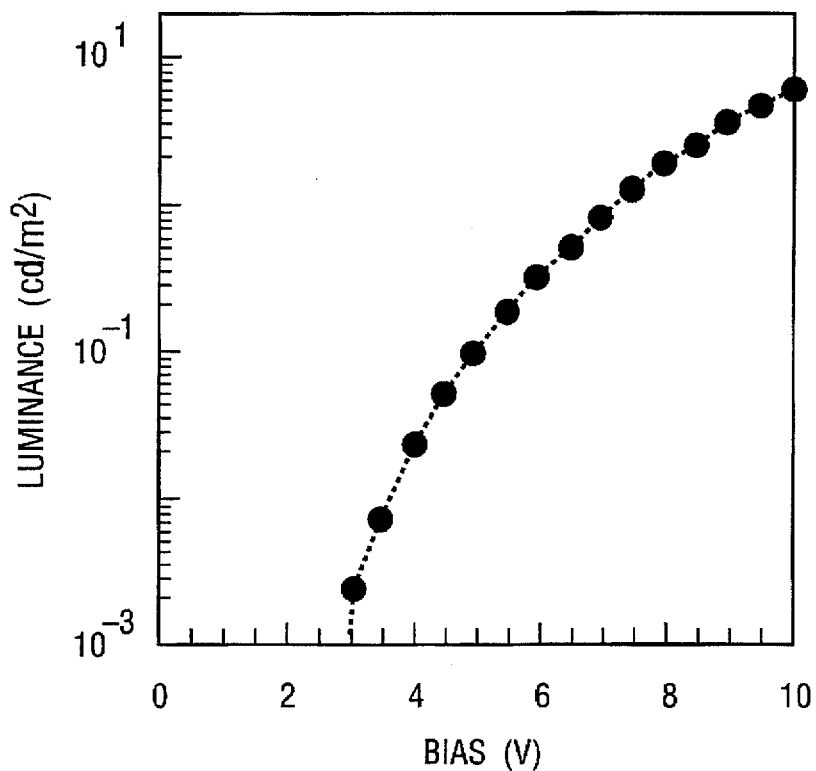

The turn-on voltage was somewhat greater than the energy gap of the luminescent polymer (the turn on was approximately 3 V, see FIG. 5; the energy gap of MEH-PPV is approx. 2.1 V). The operating voltage can be further reduced by fabricating polymer blend materials with higher ionic conductivity and/or by utilizing interdigitated electrodes with narrower inter-electrode spacing.

Example 2

Surface light-emitting electrochemical cell devices were fabricated by drop casting the active blend from solution onto a glass substrate with interdigitated gold electrodes fabricated by photolithographic methods. The gap size between the interdigitated electrodes was 30 μm and the width of the individual electrodes was 10 μm. The total equivalent length of the electrode is 22.5 cm. The L/W ration is 550. The lateral dimensions of the device were 3 mm×3 mm; i.e. with a total area of 0.09 cm$^2$. The thickness of the drop cast film used in this example was greater than one micron.

Figure 6:
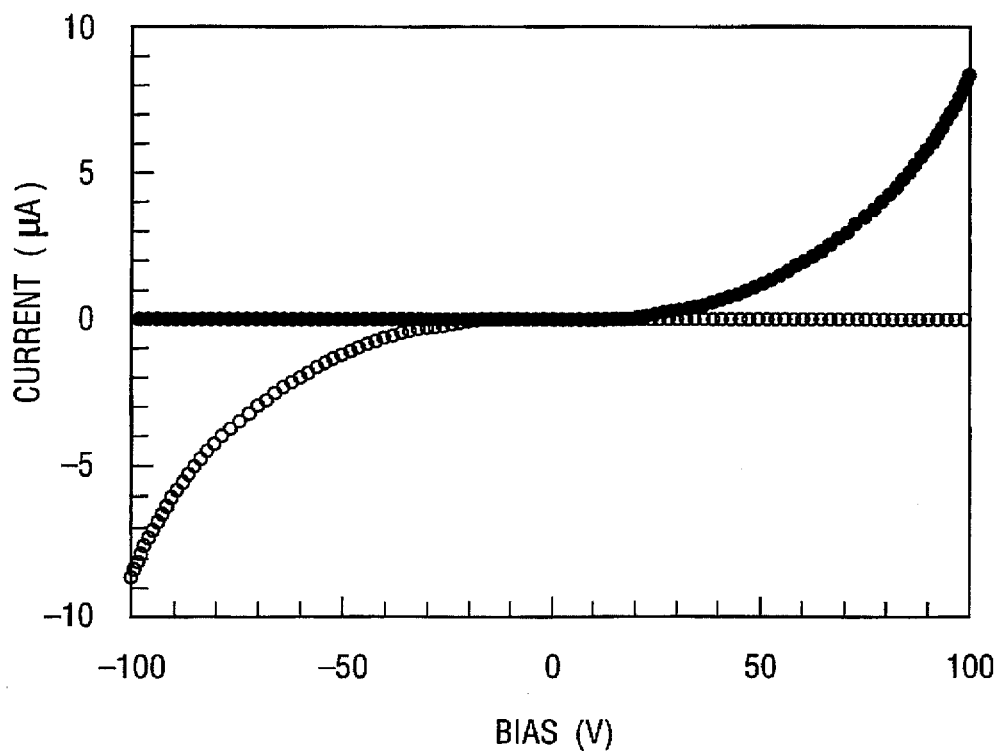
FIG. 6 is a current vs voltage curve for a device of this invention.

A typical current(I) vs voltage (V), I-V dependence obtained from a 30 μm gap device is shown in FIG. 6. This asymmetric I-V curve (solid dots) was recorded after biasing the device in a given polarity for about one minute. The rectification ration is >100 at 90 V, corresponding to a field strength of 3×10$^4$ V/cm. In contrast, the common field strength used for polymer LEDs in the sandwich configuration is ~10$^6$ V/cm.

This rectifying diode characteristic was erased by applying an alternating field with gradually-attenuated magnitude. The device was switched into the opposite direction by first applying the external field in the reverse direction. Also plotted in FIG. 6 is the I-V characteristic of the same device after applying field in reverse direction (open dots) for ~5 minutes. Nearly identical rectifying behavior is created in the opposite direction. The switching time can be reduced significantly with reduced gap size or with blends of higher ionic mobility.

This example demonstrates that a rectifying diode can be generated in-situ and that said diode behavior can be erased in the surface configuration electrochemical cell with the application of external bias; i.e., the in-situ electrochemical doping results in the formation of a dynamic p-n junction within the polymer blend. This rectifying diode can be switched to the opposite direction with reversed bias.

This example and the results of example 1 demonstrate that the operating voltage can be adjusted by changing the gap size; for large gaps, the high series resistance increases the turn-on and the operating voltage. Since the electroluminescent intensity is proportional to the total length of the electrode, an increase in the number of the interdigitated electrodes (achieved by reducing the gap size and the electrode width) results in an increase in the device luminance. Thus, the surface interdigitated electrode geometry provides two independent parameters which enable separate control of the operating voltage and the device brightness. The results of Examples 1 and 2 demonstrate that by means of geometric design of the electrode, one can achieve a desired luminescent pattern at a given bias.

Example 3

Surface light-emitting electrochemical cell devices were fabricated by drop casting the active blend from solution onto a substrate with interdigitated gold electrodes fabricated by photolithographic methods. The gap size between the interstitial electrodes was 30 μm and the width of the individual electrodes was 10 μm, as described in detail in Example 2.

Figure 7:
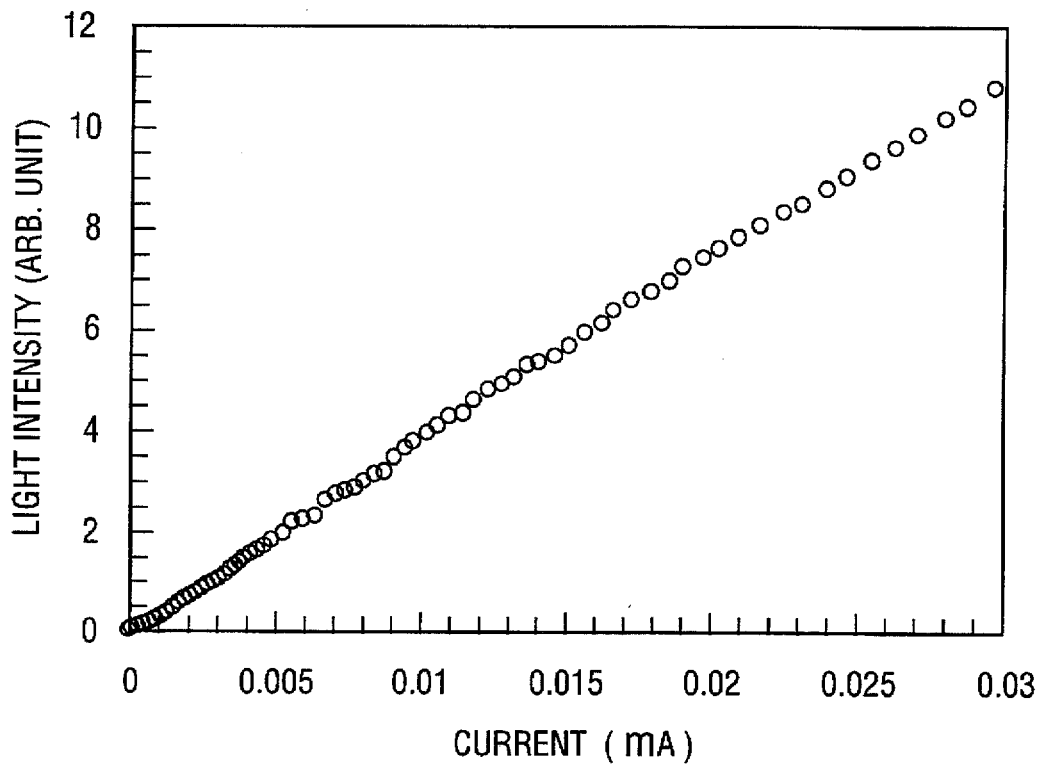
FIG. 7 is a graph of emitted light intensity as a function of current for a surface cell device.
Figure 8:
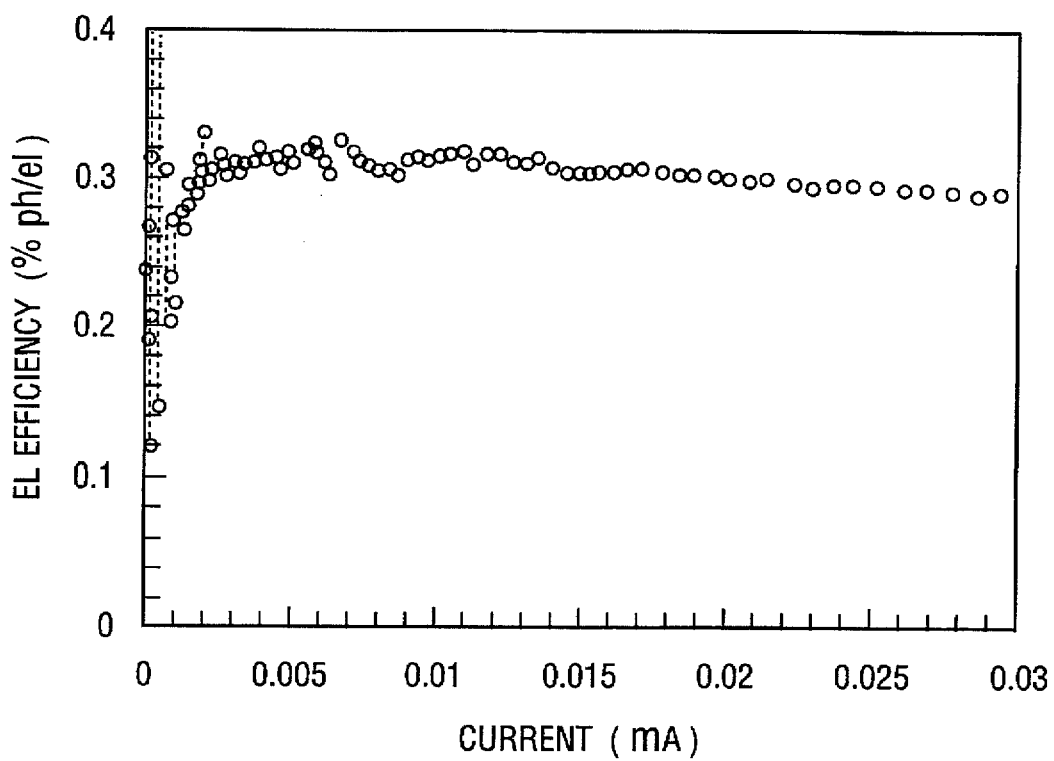
FIG. 8 is a graph of electroluminescent efficiency as a function of current for such a device.

The emitted light intensity was proportional to the injected current as demonstrated in FIG. 7. The EL efficiency of this device was measured to be ~0.3% photons/electron, as shown in FIG. 8. These data were collated only from light emitted from the front of the device. The EL efficiency in reference light emitting electrochemical cells in the sandwich configuration fabricated with the same LEEC blends was ~0.5–0.7% ph/el (with the blend thickness of ~1500 Å). Thus, including the EL emission in both front and back directions, the total EL efficiency in the surface cell was similar to that in sandwich cell device.

This example demonstrates that the electroluminescence efficiency (and thus, the probability of radiative recombination) in the surface electrochemical cell is similar to that in sandwich cells, although the gap sizes are quite different.

Example 4

Figure 9:
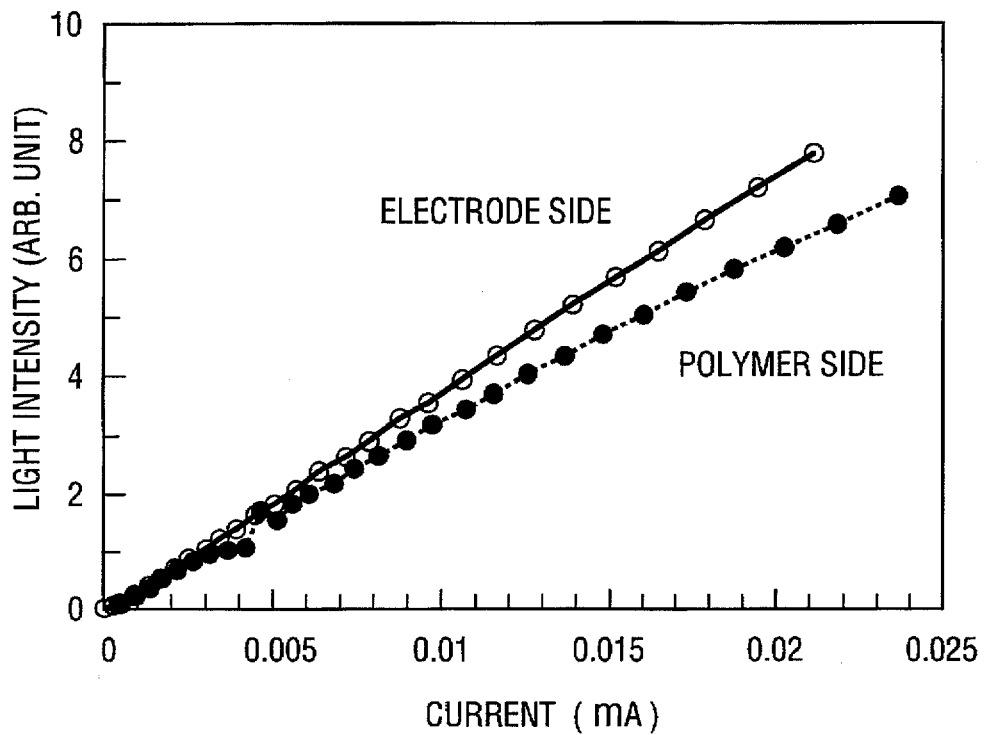
FIG. 9 is a graph of electroluminescence intensities collected in front of and in back of a device with a transparent substrate as a function of drive current.

Light-emitting electrochemical cells were fabricated in the surface cell configuration (30 μm gap) utilizing transparent substrates. Light was emitted and observed from both front and back directions. The EL intensities collected in both front and back directions are plotted as a function of the drive current in FIG. 9. The semiconducting, luminescent and ionically conducting blend was drop-cast with thickness ~1 μm. Although relatively thick (with OD>3 at 500 nm), the blend film was transparent at the emission wavelength (below the polymer absorption edge). Correcting for the residual absorption by the polymer blend, the emission intensities into both front and back directions were similar. With blend films less than OD=3 at the absorption peak (i.e. with thicknesses less than 3000 Å), there will be no significant difference in light intensity emitted in the two directions.

This example demonstrates a novel feature of the surface cell configuration; the emitted light can be viewed from both the front and the back side of the display; an obvious advantage for display applications.

Example 5

Figure 10:
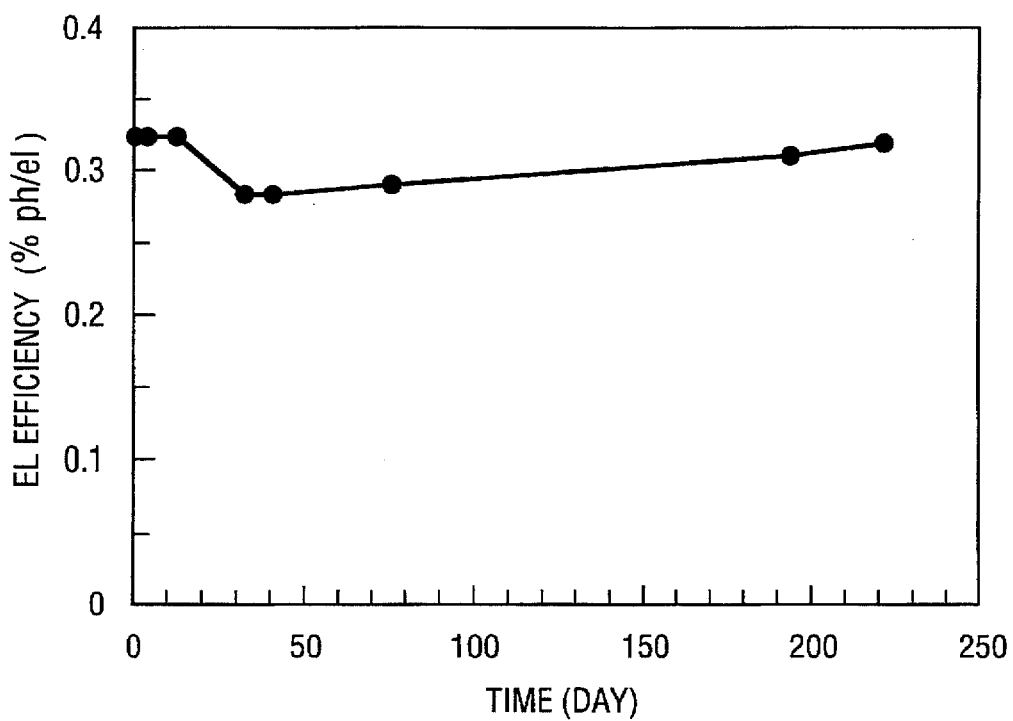
FIG. 10 is a graph showing the good shelf-life achieved with the devices of this invention.

The shelf life of the surface EL cells was monitored for a period in excess of eight months. The device used in this Example was a 30 μm gap surface cell; the device was stored in a controlled atmosphere (Argon) dry box during the entire test period. In FIG. 10, the efficiency at I=10 μA is plotted as function of storage time. The EL efficiency remains at the level of 0.3% ph/el during the entire period; no degradation of EL efficiency was observed.

Black spot formation has become one of the key issues limiting the shelf life of conventional organic and polymer LEDs. This black spot formation is associated with deterioration of the cathode/polymer interface. Since the light-emitting electrochemical cell is fabricated with the semiconductor polymer in its neutral form, since stable metals are used for the contacting electrodes, and since the electrochemically induced p-n junction is generated in-situ, all components are environmentally stable in the quiescent "off" state. As a result, light-emitting electrochemical cells exhibit intrinsically longer shelf life when compared to conventional polymer light-emitting diodes. Indeed, light-emitting electrochemical cells in the surface cell configuration, fabricated with either Au or PANI electrodes, showed no black spots after storage for 8 months.

What is claimed is:

1. A light-emitting device comprising an anode and a cathode in electrical contact with a film of electroluminescent material, said electroluminescent material comprising a blend of a semiconducting, luminescent, conjugated, organic polymer and an ionic species source said film having two sides with both of the anode and cathode in contact with the same side of the film thereby providing a surface cell configuration.

2. The light-emitting device of claim 1 additionally comprising a substrate supporting the film and the anode and the cathode.

3. The light-emitting device of claim 2 wherein the substrate is transparent.

4. The light-emitting device of claim 3 wherein the substrate is glass.

5. The light-emitting device of claim 3 wherein the substrate is plastic.

6. The light-emitting device of claim 5 wherein the substrate is flexible.

7. The light-emitting device of claim 1 wherein the anode and cathode are present as interdigitated electrodes.

8. The light-emitting device of claim 1 wherein there are a plurality of anodes and a plurality of cathodes all contacting the same side of the film.

9. The light-emitting device of claim 8 wherein the plurality of anodes and plurality of cathodes are present as interdigitated electrodes.

10. The light-emitting device of claim 9 wherein the interdigitated electrodes are patterned with closely spaced anode-cathode pairs separated from other closely spaced pairs by a larger distance.

11. The light-emitting device of claim 2 wherein the anode and cathode are present as interdigitated electrodes.

12. The light-emitting device of claim 11 wherein there are a plurality of anodes and a plurality of cathodes all in touch with the same side of the film.

13. The light-emitting device of claim 12 wherein the plurality of anodes and plurality of cathodes are present as interdigitated electrodes.

14. The light-emitting device of claim 13 wherein the interdigitated electrodes are patterned with closely spaced anode-cathode pairs separated from other closely spaced pairs by a larger distance.

15. The light-emitting device of claim 1 wherein the anode and cathode are metallic.

16. The light-emitting device of claim 1 wherein the anode and cathode are conductive organic polymer.

17. The light-emitting device of claim 16 wherein the conductive organic polymer is conductive polyaniline.

18. The light-emitting device of claim 1 wherein the anode and cathode are transparent conductive metal oxide.

19. The light-emitting device of claim 18 wherein the transparent conductive metal oxide is indium/tin oxide.

20. The light-emitting device of claim 2 wherein the anode and cathode are metallic.

21. The light-emitting device of claim 7 wherein the anode and cathode are metallic.

22. A light-emitting electrochemical cell in a surface cell configuration comprising a substrate having a substrate surface, at least one anode and at least one cathode, present as an interdigitated pattern upon said substrate surface, and a film of electroluminescent material, itself comprising semiconducting, luminescent, conjugated organic polymer admixed with an ionic species source, in contact with said substrate surface and the interdigitated pattern of anode and cathode thereupon.

23. The light-emitting device of claim 22 wherein the anode and cathode are metallic.

24. A method for generating a useful level of light comprising applying a voltage exceeding the turn-on voltage across the anode and cathode of a light-emitting device comprising an anode and a cathode in electrical contact with a film of electroluminescent material, said electroluminescent material comprising a blend of a semiconducting, luminescent, conjugated, organic polymer and an ionic species source said film having two sides with both of the anode and cathode in contact with the same side of the film thereby providing a surface cell configuration and detecting the light emitted from said device.

* * * * *